(12) United States Patent
Demore

(10) Patent No.: US 6,380,623 B1
(45) Date of Patent: Apr. 30, 2002

(54) MICROCIRCUIT ASSEMBLY HAVING DUAL-PATH GROUNDING AND NEGATIVE SELF-BIAS

(75) Inventor: Walter R. Demore, La Crescenta, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/418,870

(22) Filed: Oct. 15, 1999

(51) Int. Cl.[7] .................. H01L 29/80; H01L 27/108; H01L 23/62; H01L 29/864; H05K 1/16
(52) U.S. Cl. .................. 257/723; 257/275; 257/301; 257/691; 257/723; 257/724; 257/308; 257/363; 257/173; 257/725; 257/604; 257/664; 257/728; 257/532; 257/533; 257/534; 257/924; 361/766; 361/807; 361/808; 361/821
(58) Field of Search ................ 257/275, 301, 257/691, 723, 724, 308, 363, 173, 725, 604, 664, 728, 532, 533, 924, 332, 534; 361/766, 807, 808, 821

(56) References Cited

U.S. PATENT DOCUMENTS 4,737,236 A * 4/1988 Perko et al. ............... 156/644
4,951,014 A * 8/1990 Wohler et al. ............. 333/246
5,608,261 A * 3/1997 Bhattacharyya et al. .... 257/700
5,717,245 A * 2/1998 Pedder ....................... 257/691
5,889,325 A * 3/1999 Uchida et al. .............. 257/724
5,953,213 A * 9/1999 Napierala ................... 361/760
6,127,894 A * 10/2000 Alderton ..................... 330/286
2001/0039074 A1 * 11/2001 Bertin et al. ................ 438/107

FOREIGN PATENT DOCUMENTS

JP    59123250 A * 7/1984
JP    63015435 A * 1/1988

* cited by examiner

*Primary Examiner*—Stephen D. Meier
*Assistant Examiner*—James Mitchell

(57) ABSTRACT

A microwave-frequency microcircuit assembly includes an integrated circuit structure having a circuit ground. A support structure includes a grounded metallic carrier, and a dielectric substrate having a top surface, a bottom surface contacting the carrier, and a capacitor via extending through the dielectric substrate. A metallization on the top surface of the substrate includes an input metallization trace to the integrated circuit structure, an output metallization trace from the integrated circuit structure, and a substrate ground plane upon which the integrated circuit structure is affixed. A thin-film capacitor resides in the capacitor via and is electrically connected between the substrate ground plane and the carrier. An electrical resistor is connected between the circuit ground of the integrated circuit structure and the carrier to self-bias the integrated circuit structure.

16 Claims, 2 Drawing Sheets

MICROCIRCUIT ASSEMBLY HAVING DUAL-PATH GROUNDING AND NEGATIVE SELF-BIAS

BACKGROUND OF THE INVENTION

This invention relates to the support, grounding, and self-biasing of microcircuits, and, more particularly, to the support, grounding, and self-biasing of microwave monolithic integrated circuits.

A microwave monolithic integrated circuit (MMIC) is a microelectronic device used to process microwave signals having frequencies of from about 0.9 GHz (gigahertz) to about 100 GHz. In one example, a signal is input to a MMIC on an input microwave stripline, processed as by amplification of the signal in the MMIC, and output on an output microwave stripline. Such amplifier MMICs are used in communications satellites to boost the signal strength of microwave signals received from earth, prior to re-transmission.

A typical MMIC microcircuit assembly includes an electrically grounded metallic carrier and an electrically non-conducting substrate mounted to the carrier. The MMIC lies within a window-like via through the substrate, and is mounted directly to the carrier. The striplines are supported on the substrate, and electrically interconnected to the MMIC with wire bonds.

In an MMIC microcircuit assembly, an electrical ground is established as a reference. In the usual case, a circuit ground on the MMIC is contacted directly to the grounded metallic carrier. This grounding structure is effective for both high and low frequencies.

Power to the MMIC is provided from a power source, such as a solar power system in the case of the communications satellite. The power source provides power to precision power supplies, which in turn power the circuitry of the MMIC. Positive and/or negative (relative to the electrical ground) power supplies are provided as necessary for the circuitry of the MMIC.

Existing MMIC microcircuit assemblies work well, and are widely used. However, there is an ongoing need to reduce the size, weight, and complexity of MMIC-based systems, particularly those used for space applications. The present invention fulfills this need, and further provides related advantages.

SUMMARY OF THE INVENTION

The present invention provides a microcircuit assembly that permits elimination of a negative power supply through self-biasing of an integrated circuit. The self-biasing is achieved through a change in the architecture of the microcircuit assembly that adds very little weight. The result is a net reduction in size, weight, and complexity of the assembly. The approach of the invention is particularly useful for microwave microcircuit assemblies, such as monolithic microwave integrated circuits.

In accordance with the invention, a microcircuit assembly comprises an integrated circuit structure having a circuit ground, an electrical input to the integrated circuit structure, and an electrical output from the integrated circuit structure. The integrated circuit structure, such as a monolithic microwave integrated circuit (MMIC), preferably operates in the microwave range of from about 0.9 to about 100 GHz (gigahertz). The microcircuit assembly further includes a carrier having a carrier ground thereon, and a dielectric substrate having a top surface, a bottom surface contacting the carrier, and a capacitor interconnect extending through the dielectric substrate. The capacitor interconnect is in communication with the carrier ground of the carrier. There is a metallization on the top surface of the substrate, with the metallization including a substrate ground plane upon which the integrated circuit structure is affixed. The electrical input and output of the microcircuit assembly may be formed as striplines in the metallization. A capacitor is electrically connected between the substrate ground plane and the carrier ground on the carrier. The capacitor is preferably a thin-film capacitor disposed within a capacitor via through the substrate. Desirably, an electrical resistor, which may be one or more of a set of resistors deposited on the substrate, is electrically connected between the circuit ground of the integrated circuit structure and the carrier ground.

The present architecture provides two grounding paths between the microcircuit assembly and the carrier (DC) ground. One grounding path is through the capacitor connected between the substrate ground plane and the carrier ground, which is effective at relatively lower frequencies. At higher frequencies, this grounding path becomes less effective due to the reactances of the wire bonds used to interconnect the capacitor. The second ground path is the effective capacitance established between the substrate ground plane and the carrier, through the dielectric substrate. This second grounding path becomes more important at higher frequencies, supplementing the first grounding path through the capacitor.

With this arrangement, where the integrated circuit is isolated from the carrier ground except for the grounding paths through capacitive structures, the circuit ground of the integrated circuit may be connected to the carrier ground through a resistor, which effectively biases the circuit ground negatively. A negative bias on the associated portions of the integrated circuit is thereby established. The value of the negative bias may be established by selection of the electrical resistance of the resistor. To provide a range of resistances and thereby a range of negative bias values, two or more resistors may be formed on the substrate in an array. The integrated circuit is connected to any selected one or ones of the resistances with the appropriate wirebonds.

More generally, a microcircuit assembly comprises an integrated circuit structure having a circuit ground, an electrical input to the integrated circuit structure, an electrical output from the integrated circuit structure, a carrier having a carrier ground thereon, and a dielectric substrate having a top surface to which the integrated circuit structure is affixed and a bottom surface affixed to the carrier. The microcircuit assembly further includes a capacitor structure electrically connected between the circuit ground and the carrier ground on the carrier, and an electrical resistor electrically connected between the circuit ground of the integrated circuit structure and the carrier.

This approach provides grounding of the integrated circuit, while at the same time allowing a negative bias to be established in the integrated circuit structure without the use of a negative power supply. The result is reduced size, weight, and complexity of the electrical system. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
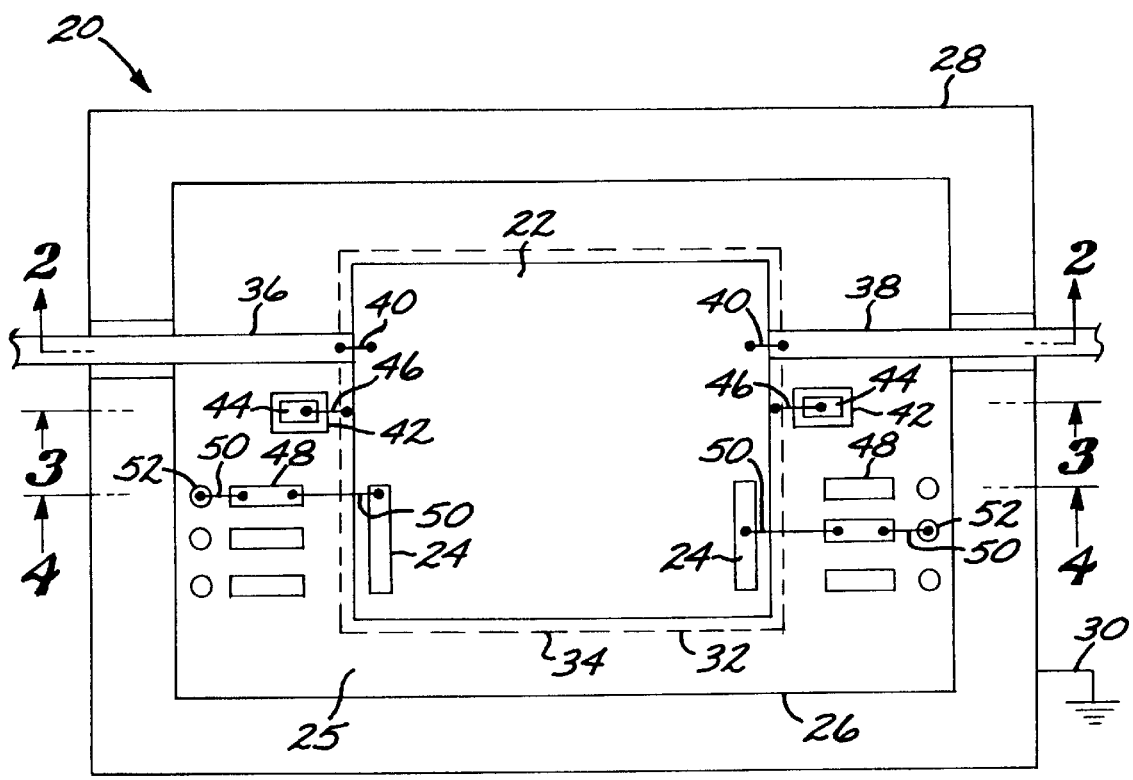
FIG. 1 is a schematic plan view of a microcircuit assembly.
Figure 2:
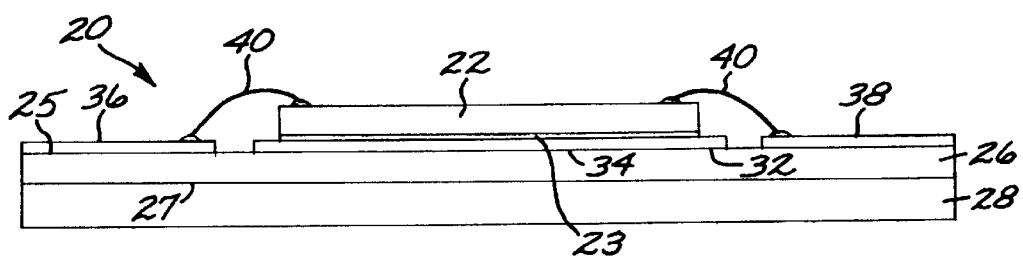
FIG. 2 is a schematic sectional view of the microcircuit assembly, taken along line 2—2 of FIG. 1.
Figure 3:
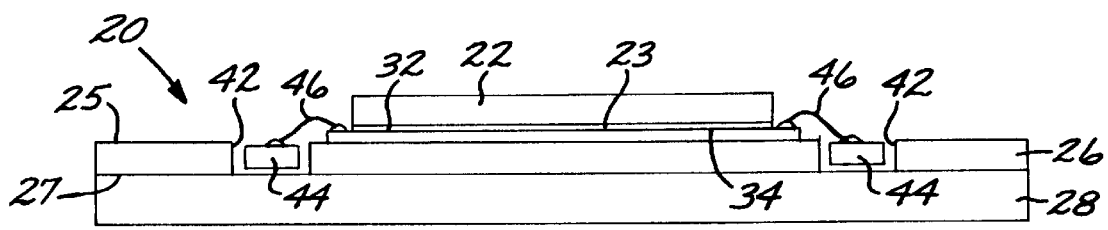
FIG. 3 is a schematic sectional view of the microcircuit assembly, taken along line 3—3 of FIG. 1.
Figure 4:
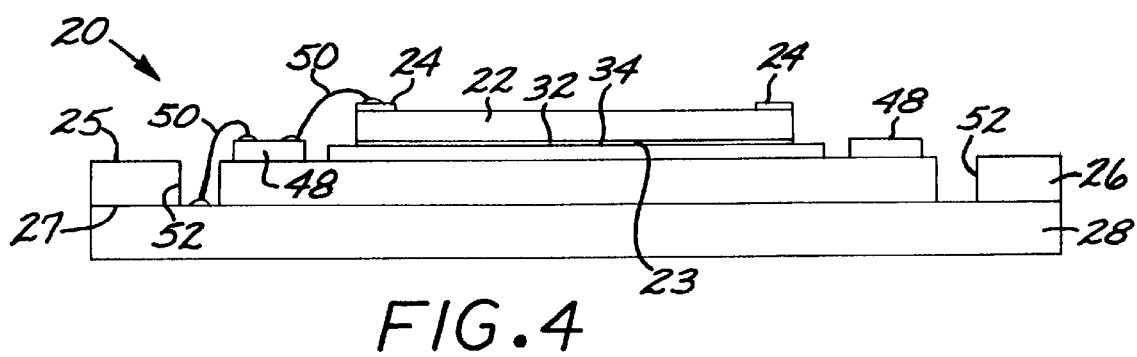
FIG. 4 is a schematic sectional view of the microcircuit assembly, taken along line 4—4 of FIG. 1.

FIG. 1 schematically illustrates a microcircuit assembly 20 in plan view, and FIGS. 2–4 are schematic sectional views through various portions of the microcircuit assembly 20 of FIG. 1. The microcircuit assembly 20 includes an integrated circuit structure 22, whose bottom has a full or partial metallization 23, and further having a circuit ground 24. The microcircuit assembly preferably comprises an electronic device operable to process electrical signals having a frequency in the microwave range, which is typically from about 0.9 GHz (gigahertz) to about 100 GHZ. One such electronic device is a monolithic microwave integrated circuit (MMIC). Such electronic devices are known in the art.

The integrated circuit structure 22 is supported on a top surface 25 of a dielectric substrate 26, which has an oppositely disposed bottom surface 27. The substrate 26 is made of an electrical nonconductor, such as aluminum oxide, and is typically from about 0.010 inch to about 0.025 inch thick.

The bottom surface 27 of the substrate 26 is supported on a carrier 28, which is preferably an electrical conductor such as copper-tungsten composite material or kovar alloy. The carrier 28 may instead be made of an electrical nonconductor, with a layer of electrically conductive material such as aluminum deposited thereon to form a ground plane. The carrier 28 is electrically grounded by a ground 30.

A metallization 32 is deposited on the top surface 25 of the substrate 26. The metallization is a thin layer of an electrical conductor such as TiW coated with gold. The metallization 32 is patterned to define a substrate ground plane 34 that underlies the integrated circuit structure 22, which has the bottom metallization 23 to enable grounding through the substrate ground plane 34. The metallization 23 is in electrical contact with the metallization 32 and the substrate ground plane 34. The metallization 32 extends a small distance laterally outwardly from the integrated circuit structure 22 to permit wirebonding thereto. The substrate ground plane 34 is in a facing-but-spaced-apart relationship to the surface of the carrier 28, with the dielectric substrate 26 therebetween. This forms a capacitance relationship which will be discussed subsequently in greater detail.

An electrical input 36 extends to the integrated circuit structure 22, and an electrical output 38 extends from the integrated circuit structure 22. In practical applications, there are typically several such inputs 36 and outputs 38, but only one of each is illustrated for clarity. The electrical input 36 and the electrical output 38 are preferably patterned portions of the metallization 32 as illustrated, and may be described as traces, microstrips, or striplines. The electrical input 36 and the electrical output 38 may instead be wires or waveguides. The adjacent ends of the electrical input 36 and the electrical output 38 are electrically connected to the appropriate locations on the integrated circuit structure 22 by any operable approach, here illustrated as respective wirebonds 40.

The substrate 26 has capacitor interconnects therethrough at locations adjacent to the wirebonds 40 where the electrical input 36 and the electrical output 38 are interconnected to the integrated circuit structure 22. Preferably and as illustrated, the capacitor interconnects are capacitor vias 42 that are openings through the thickness of the substrate 26 from its top surface 25 to its bottom surface 27.

A capacitor 44 is electrically connected between the substrate ground plane 34 and the carrier ground 30 through the carrier 28. Preferably, the capacitor 44 is a thin-film capacitor that is received into the capacitor via 42. The top side of the capacitor 44 is electrically connected to the substrate ground plane 34 by a capacitor wire bond 46, and the bottom side of the capacitor 44 is in direct physical and electric contact with the metallic carrier 28 or, where present, the metallic layer on the top side of the carrier 28.

The integrated circuit structure 22 is electrically isolated from the carrier 28, but is grounded through the carrier 28. The described structure provides two grounding paths for the integrated circuit structure. The first grounding path is through the capacitor 44. This first grounding path is most effective at relatively low frequencies, such as below about 2–3 GHz. It becomes less effective at higher frequencies, because of the reactance of the capacitor wire bond 46. The second grounding path is through the effective capacitor formed by the substrate ground plane 34 (which is in electrical contact with the integrated circuit structure 22 through the metallization 23), the dielectric substrate 26, and the carrier 28. This second grounding path supplements the grounding of the first grounding path at higher frequencies.

An electrical resistor 48 is electrically connected between the circuit ground 24 of the integrated circuit structure 22 and the carrier ground 30 on the carrier 28. The electrical resistor 48 biases the circuit ground 24 negatively, thereby negatively biasing the associated circuit elements of the integrated circuit structure 22. In the preferred embodiment, the electrical resistor 48 is a thin-film resistor that is supported on the substrate 26. The electrical resistor 48 is electrically connected to the circuit ground 24 and the carrier 28 by resistor wirebonds 50. The wirebond 50 extending from the electrical resistor 48 to the carrier 28 may be positioned in a resistor via 52 that extends through the substrate 26.

The value of the negative bias produced by the electrical resistor 48 depends upon the value of the resistance. A single selected electrical resistor 48 may be provided, or there may be two or more such resistors in the form of an array. These resistors may be etched into the metallization 32, for example. The value of the negative bias is established by the selection of the wirebond interconnections to the resistor array. Different biases may be established to different portions of the circuitry of the integrated circuit structure 22, by interconnecting through different ones of the resistors 48 or having several resistor arrays.

The approach of the invention has been reduced to practice on several prototypes, which performed as discussed herein.

Figure 5:
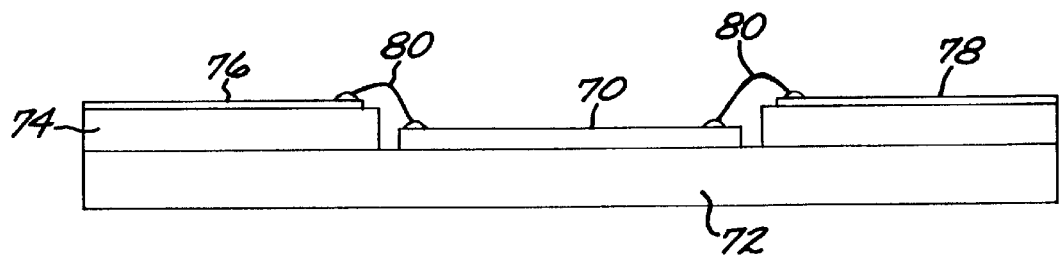
FIG. 5 is a schematic sectional view comparable to that of FIG. 2, of an alternative microcircuit assembly.

The structure according to the present invention is to be contrasted with an alternative structure illustrated in FIG. 5, which is not within the scope of the invention. Here, an integrated circuit structure 70 is affixed directly to a carrier 72. A dielectric substrate 74 also is affixed to the carrier 72. An electrical input 76 and an electrical output 78 are supported on the substrate, and are electrically connected to the integrated circuit structure 70 by wirebonds 80.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microcircuit assembly, comprising:
    an integrated circuit structure having a circuit ground;
    an electrical input to the integrated circuit structure;
    an electrical output from the integrated circuit structure;
    an electrically conductive carrier having a carrier ground thereto;
    a dielectric substrate having a top surface and a bottom surface contacting the carrier;
    a metallization on the top surface of the substrate, the metallization including a substrate ground plane upon which the integrated circuit structure is affixed; and
    a capacitor electrically connected between the substrate ground plane and the carrier ground.

2. The microcircuit assembly of claim 1, further including an electrical resistor electrically connected between the circuit ground of the integrated circuit structure and the carrier ground.

3. The microcircuit assembly of claim 1, further including
    at least two thin-film electrical resistors on the top surface of the substrate, at least one of the thin-film electrical resistors being electrically connected between the circuit ground of the integrated circuit structure and the carrier ground.

4. The microcircuit assembly of claim 1, wherein the integrated circuit structure is a monolithic microwave integrated circuit.

5. The microcircuit assembly of claim 1, wherein the integrated circuit structure is operable to process signals having a frequency of no less than about 0.9 GHz.

6. The microcircuit assembly of claim 1, wherein the electrical input and the electrical output are formed in the metallization on the top surface of the substrate.

7. The microcircuit assembly of claim 1, wherein the carrier is metallic and is grounded, thereby serving as the carrier ground.

8. The microcircuit assembly of claim 1, further including:
    a capacitor interconnect extending between the top surface and the bottom surface of the dielectric substrate.

9. The microcircuit assembly of claim 8, wherein the capacitor interconnect is a capacitor via, and wherein the capacitor is a thin-film capacitor residing within the capacitor via.

10. A microcircuit assembly, comprising:
    an integrated circuit structure having a circuit ground, wherein the integrated circuit structure is operable to process signals having a frequency of no less than about 0.9 GHz;
    a grounded metallic carrier;
    a dielectric substrate having a top surface, a bottom surface contacting the carrier, and a capacitor via extending through the dielectric substrate;
    a metallization on the top surface of the substrate, the metallization including
        an input metallization trace to the integrated circuit structure,
        an output metallization trace from the integrated circuit structure, and
        a substrate ground plane upon which the integrated circuit structure is affixed; and
    a capacitor residing in the capacitor via and electrically connected between the substrate ground plane and the carrier.

11. The microcircuit assembly of claim 10, wherein the integrated circuit structure comprises a monolithic microwave integrated circuit.

12. The microcircuit assembly of claim 10, further including an electrical resistor electrically connected between the circuit ground of the integrated circuit structure and the carrier.

13. The microcircuit assembly of claim 10, further including
    at least two thin-film electrical resistors on the top surface of the substrate, at least one of the thin-film electrical resistors being electrically connected between the circuit ground of the integrated circuit structure and the grounded metallic carrier.

14. A microcircuit assembly, comprising:
    a monolithic microwave integrated circuit structure having a circuit ground;
    a grounded metallic carrier;
    a dielectric substrate having a top surface, a bottom surface contacting the carrier, and a capacitor via extending through the dielectric substrate;
    a metallization on the top surface of the substrate, the metallization including
        an input metallization trace to the integrated circuit structure,
        an output metallization trace from the integrated circuit structure, and
        a substrate ground plane upon which the integrated circuit structure is affixed;
    a capacitor residing in the capacitor via and electrically connected between the substrate ground plane and the carrier; and
    an electrical resistor electrically connected between the circuit ground of the integrated circuit structure and the carrier.

15. The microcircuit assembly of claim 14, further including
    at least two thin-film electrical resistors on the top surface of the substrate, at least one of the thin-film electrical resistors being electrically connected between the circuit ground of the integrated circuit structure and the grounded metallic carrier.

16. A microcircuit assembly, comprising:
    an integrated circuit structure having a circuit ground;
    an electrical input to the integrated circuit structure;
    an electrical output from the integrated circuit structure;
    an electrically conductive carrier having a carrier ground thereto;
    a dielectric substrate having a top surface to which the integrated circuit structure is affixed and a bottom surface affixed to the carrier;
    a capacitor structure electrically connected between the circuit ground and the carrier ground through the carrier; and
    an electrical resistor electrically connected between the circuit ground of the integrated circuit structure and the carrier.

* * * * *